Jan. 14, 1964 A. D. STEPHENSON, JR 3,118,016

CONDUCTOR LAMINATE PACKAGING OF SOLID-STATE CIRCUITS

Filed Aug. 14, 1961

ALVIS D. STEPHENSON, JR.
INVENTOR.

BY D. Carl Richards 3,118,016

CONDUCTOR LAMINATE PACKAGING OF SOLID-STATE CIRCUITS

Alvis D. Stephenson, Jr., Dallas, Tex., assignor to Texas Instruments Incorporated, Dallas, Tex., a corporation of Delaware Filed Aug. 14, 1961, Ser. No. 131,170
10 Claims. (Cl. 174—68.5)

This invention relates to a conductor laminates assembly for mounting solid-state circuits in module bays through the use of a tailored multilayer conductor-insulator stack providing a plurality of circuit-receiving bays.

The development of semiconductor devices has led to the production of complete electrical circuits in solid-state form and small size. Semiconductor networks of the type illustrated and described by Lathrop et al. in "Electronics," May 13, 1960, in an article entitled "Semiconductor Networks," may include within a module having dimensions of ¼ inch, ⅛ inch and 1/32 inch a complete operative unit such as a multivibrator, an inverter, phase shift oscillator or a variety of other circuits such as counters and gates. Each such module may have a plurality of leads for connecting the module to external signal and supply circuits. In devices thus far provided, up to ten leads may extend from the sides of a given module, with as many as five extending from one edge and up to five leads extending from an opposite edge. When several such blocks or modules are to be interconnected in a system, it becomes impossible to closely space the modules and interconnect them with conventional circuit techniques. On the other hand, if the modules are not closely spaced, advantages of miniaturization are diminished. It is desirable, where closely spaced modules are to be employed, to provide for heat removal. It is further desirable that fabrication techniques be adaptable to automation in order that uniformity of product may be more carefully controlled.

It is an object of the invention to provide a packaging method for solid-state circuits which will integrate the mechanical structural members and electrical conductive paths in such a way as to confine an electronic system within a minimum volume. It is a further object of the invention to provide packaging of solid-state circuits which will allow automated assembly and testing processes to be employed thereby permitting increased production rates. A further object of the invention is to provide a packaging method which will have predetermined electrical, mechanical and thermal characteristics which become important when packaging constants are considered in the initial design of the solid-state network in order to reduce design efforts to a minimum. Achievement of this object may provide for optimum heat removal rates through either conduction techniques in solid or liquid bodies or convection techniques or electric cooling techniques. A further object is to provide a packaging method which will allow individual removal and replacement of solid-state networks and which will accommodate molecular interlocking or bonding of electrical conducting paths such as by welding, thermal compression bonding or alloying, etc. for assuring maximum reliability of the electrical connections.

The present invention provides for the mounting of solid-state circuits in such a manner that they may be assembled under automation control, may be readily accessible for repair or replacement and at the same time provide for heat removal.

More particularly in accordance with the present invention, there is provided a system in which a plurality of layers of conductive sheets and insulating sheets are interleaved with one another and are characterized by having aligned bays therein with uniformly spaced conductive tabs forming parts of the conductive sheets and extending into the bays. A multiterminal circuit module is mounted in each of the bays with terminals thereon selectively connected to tabs from selected ones of said conductive sheets for support of the module and for completing conductive paths between the modules.

For a more complete understanding of the present invention and for further objects and advantages thereof, reference may now be had to the following description taken in conjunction with the accompanying drawings in which.

Figures 1, 2:
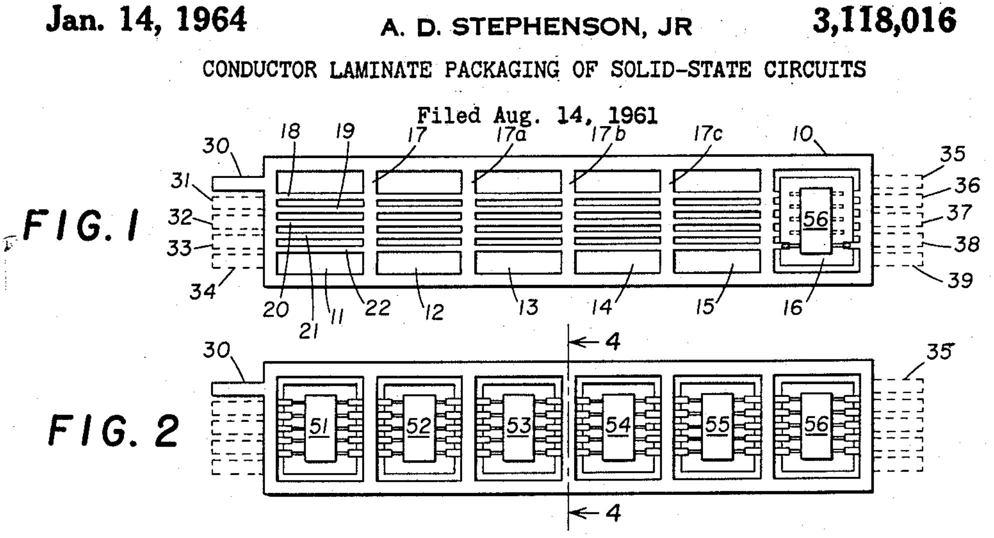
FIG. 1 is a connector blank.
FIG. 2 illustrates a plurality of mounted modules.

Referring now to FIG. 1, there is illustrated a connector element 10 in which there are formed a plurality of bays 11, 12, 13, 14, 15 and 16. The connector 10 has an outer rim which forms a rectangular border. Cross bars **17–17*c* divide the connector into sections as to form bays 11–16. Initially a plurality of conductive strips 18, 19, 20, 21, 22 extend the length of the connector 10. The strips 18–22 are uniformly spaced one from another and are positioned for registration with leads which may extend from a solid-state network or module of the type represented by the module 56. Such networks have conductive leads extending from opposite edges of a solid body. Leads may be necessary for operation of the modules at any one or all of the five locations on each side. The connector 10 is preferably formed from a thin sheet of a nickel-iron-cobalt alloy sold under the trademark, Kovar, is gold-plated to enhance conductivity, inhibit corrosion and to facilitate forming connections thereto. The metallic portions of the connector preferably are of the order of 0.002 to 0.003 inch thick. The connector 10 may be considered to be a universal connector unit having end connector tabs 30–39. As shown, tab 30 is selected from end arrays which initially are provided including tabs 31–39 (shown dotted). The ends of the connector 10 may be tailored by removing selected ones of the end tabs to provide end connections of any desired pattern. In a preferred form, the connector element 10** is adhesively secured or otherwise formed on an insulator sheet such as a plastic film made of a polyester or fluorocarbon such as manufactured and sold by Du Pont of Wilmington, Delaware, under the trademarks Mylar or Teflon, respectively. Such film preferably is of low dielectric constant. Preferably such sheet would have a thickness in the order of 0.002 to 0.005 inch.

Figure 4:
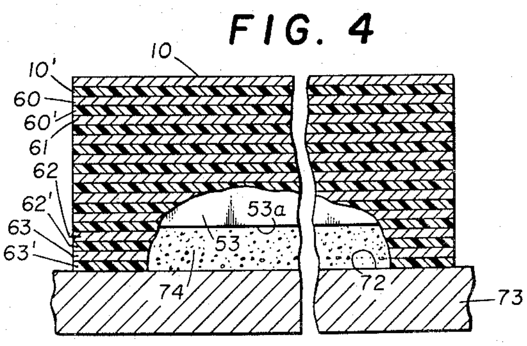
FIG. 4 is an enlarged sectional view taken along lines 4—4 of FIG. 2.

A plurality of connectors such as connector 10 are then stacked with the bays 11–16 in alignment. Such assembly is shown in FIGURES 2 and 4 where the connector 10 forms the top layer on a stack which includes a plurality of layers. If necessary, layers may be provided in number less than, equal to or greater than the number of leads from a given circuit module. It will be assumed that ten of the connectors 10 form a stack which is characterized by a plurality of bays therein. The strips 18–22, FIG. 1, are cut out or are selectively patterned or trimmed, as indicated in FIG. 2, to extend into the bays 11–16 to receive leads in a desired pattern. The module 51 is mounted in the bay 11, module 52 is mounted in bay 12, module 53 in bay 13, module 54 in bay 14, module 55 in bay 15, and module 56 in bay 16. While the modules 51–56 have been shown as having ten leads each extending therefrom, this pattern would be more an exception than the rule. However, in any case, the tabs extending from the intermediate bars, such as bar 17, and from the ends of the connector 10 into the bay areas are positionally aligned with the leads extending from the modules.

Figure 3:
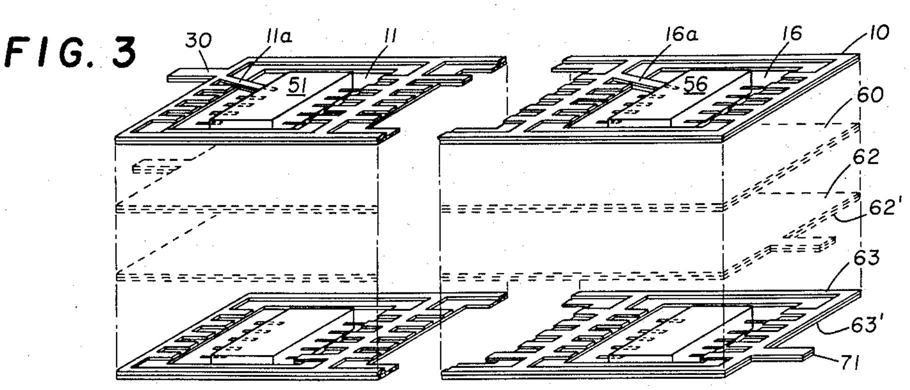
FIG. 3 is an enlarged exploded view of an assembly.

In FIG. 3 there has been illustrated an exploded view including several different layers of a multilayer stack of conductive elements. The upper layer comprises the conductive element 10 of FIG. 2 with the end tab 30 extending therefrom. The conductor has been enlarged for the purpose of clarity and shows the two bays 11 and 16 with conductive tabs selectively extending into the bay. It will be noted that the unit 10 may serve to provide a common connection to all of the modules, such as module 51, to be placed in the stack. The terminals of modules 51 and 56 connected to tabs 11*a* and 16*a* respectively of unit 10 may be connected at tab 30 to a common supply voltage source, for example, utilized by all of the modules in the stack.

Through a first layer all of the modules will be connected in parallel with respect to a first terminal of each module. Where modules are to be connected in series as may be desirable in connecting the output terminal of module 51 to the signal input terminal of module 52, the series connection may be completed utilizing only a portion of a second conductive layer. In such case the conductive layer utilized for the series connection would be discontinuous at a line corresponding wtih the center bar of 17*a*. A second portion, from bar 17*a* to bar 17*c*, of the second conductive layer would then be employed for connecting the signal output terminal of module 53 to the signal input terminal of module 54. A portion of a third conductive layer lying between the zones of bars 17 and 17*b* would be utilized for connecting the output terminal of module 52 to the input terminal of module 53. By segmenting selected conductive layers, series connections as well as the parallel connections can thus be effected.

It will also be noted that in FIGS. 1 and 2 the bays 11–16 are formed in a linear array. They may also be formed at various points distributed areally instead of linearly along a conductive sheet. While the connector stack of FIGS. 2–4 is illustrated as being planar, such stacks may be shaped in various other geometrical configurations. For example, a sheet-like stack may be bent to form a cylinder having the bays spaced around the periphery thereof. The connector construction shown herein is readily adaptable to still other configurations. Illustrated in FIG. 3 (by dotted outline) is a second unit 60, a third unit 62 and, in solid outline, a fourth unit 63. The end tab 71 of unit 63 is at the opposite edge and opposite end of the stack from tab 30. Furthermore the conductive tabs extending into bays 11–16 are provided in an array different from the array characterizing the unit 10. It will be understood that in general more layers will be provided for each stack of connecting units than the four units 10, 60, 62 and 63, FIG. 3, which are included to indicate the relative arrangement of components for assembly purposes.

It will be understood that an insulating layer will be present in between each of the layers of the units 10, 60, 61 and 62 to isolate them one from another electrically. More particularly, as illustrated in FIG. 4, which is an enlarged sectional view, conductive and insulating layers are interleaved one with another where the upper layer 10 is insulated from the next layer 60 by an insulating layer 10′. Similarly, the layer 60 is insulated from the next succeeding conductive layer 61 by the insulating layer 60′. The last two conductive layers 62 and 63 are insulated one from another by means of the insulating layer 62′. It will be recognized that any number of conductive and insulating layers may be interleaved to form a laminated connector assembly which may be selectively tailored to receive circuit modules in the bays formed therein. This method of packaging and mounting circuit elements is advantageous where many units of like configuration are to be produced. The connectors 10, 60, 61—62, 63, FIG. 4, can be designed or tailored with the tabs in desired patterns to match the connector patterns of modules 51–56. Such patterns may be machine-formed or stamped and machine-assembled so that an entire assembly may be completed almost entirely through automation techniques.

Further, the packaging and mounting of the modules in the manner illustrated in FIG. 2 permits dissipation of heat as through forced air drafts traveling between adjacent assemblies or through heat conductive connections of the type indicated in FIG. 4.

More particularly, in FIG. 4 the connector assembly of FIG. 2 is illustrated as mounted with the bottom insulator 63′ positioned on the surface 72 of a metallic plate 73. The plate 73 may be connected to a suitable heat sink and serve to conduct heat from the stack of connectors. More particularly as shown in the cutaway section, the module 53 is shown with the bottom surface 53*a* thereof spaced from the surface 72 as may be necessary in mounting a module in a given bay. A heat conductive paste forms a heat conductor body 74 between the lower surface 53*a* of the module 53 and the upper surface 72 of the plate 73. A silicon material may be found suitable for this application. One such composition is manufactured and sold by Dow Corning Corporation of Midland, Michigan, under the catalogue designation of Silicon-4. The heat conductive paste or body 74 thus serves to conduct heat from the module 53 to the metallic bar 73 while maintaining electrical insulation therebetween. By so mounting the assembly of modules, they are accessible for testing or repair or replacement and yet are mounted in a heat dissipative arrangement wtih a minimal space requirement. A relatively high density of circuit components may be achieved while at the same time permitting ready access to each individual circuit module both for repair or replacement as well as cooling purposes.

Figure 5:
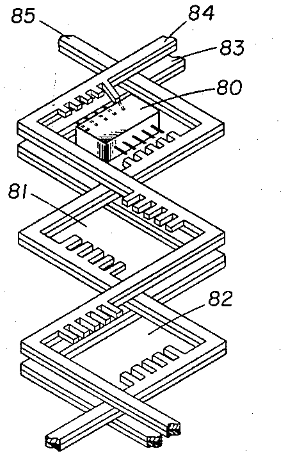
FIG. 5 illustrates a modification of the invention.

FIG. 5 illustrates a modification of the invention in which capacitive coupling between adjacent connector elements is minimized by utilizing a rip-rap configuration. In this embodiment of the invention modules, such as module 80, are mounted in bays, such as bays 81 and 82 formed by serpentine conductor-insulator elements. The elements 83 and 84 extend parallel to one another while matching elements of the configuration of element 85 overlay one another, only the element 85 being shown. It will be seen that capacitive coupling between the conductive elements of each layer is substantially reduced by reason of the fact that only relatively small areas of the conductive elements are in confronting relation. The principal capacitive zones are in the areas where the conductive layers cross one another. Thus it will be seen that in accordance with the present invention a laminate conductor-insulator system is provided as to form a plurality of aligned bays lying substantially in a planar configuration with conductive tabs extending into and contacting selectively the circuit terminals on electronic circuit modules to be mounted in the bays.

Having described the invention in connection with certain specific embodiments thereof, it is to be understood that further modifications may now suggest themselves to those skilled in the art and it is intended to cover such modifications as fall within the scope of the appended claims.

What is claimed is:

1. An electronic system which comprises a plurality of layers of sheet-like conductors and insulating sheets interleaved with one another and having aligned apertures therein with like conductive tabs selectively patterned on different ones of said sheet-like conductors forming parts of said sheet-like conductors and protruding into said apertures in different arrays, and a multiterminal circuit element in each of said apertures with terminals thereon selectively connected to said tabs for support of said element and for extending conductive paths from elements in said apertures.

2. A connector unit for connections to and physical support of solid-state semiconductor networks having terminals extending therefrom at uniformly spaced contact zones which comprises a stack of insulating sheets, a plurality of sheet-like conductors interleaved with said sheets and each having a rim of rectangular configuration and integrally formed cross bars which divide the areas bounded by each said rim into a plurality of like bays, said bays being aligned one with another in said stack with said conductors insulated one from another by said sheets, conductive tabs protruding into each of said bays from selected ones of said bars and from the ends of each said rim in zones spaced one from another in accordance with the spacing of said contact zones for receiving one of said networks in each of said bays, and at least one conductive tab extending away from each of said conductors at the ends of said stack for extending the circuit from said tabs protruding into said bays.

3. An electronic circuit connector unit which comprises a stack of insulating sheets, a plurality of planar conductors interleaved with said sheets and each having a rim of rectangular configuration and integrally formed cross bars which divide the areas bounded by each said rim into a plurality of like bays, said bays being aligned one with another in said stack with said planar conductors insulated one from another by said sheets, conductive tabs protruding into each of said bays from selected ones of said bars and from the end sections of each said rim for facilitating the connection to and support of an electronic element to be positioned in each of said bays, and a conductive tab extending away from each of said conductors at an edge of said stack for extending the circuit from said tabs protruding into said bays.

4. An electronic circuit connector unit which comprises a stack of insulating sheets, a plurality of planar conductors interleaved with said sheets and each having a rim of rectangular configuration and integrally formed cross bars which divide the areas bounded by each said rim into a plurality of like bays, said bays being aligned one with another in said stack with said planar conductors insulated one from another by said sheets, conductive tabs protruding into each of said bays from selected ones of said bars and from the ends of each said rim for facilitating the connection to and support of an electronic element to be positioned in each of said bays, and conductive tabs extending away from each of said conductors at at least one end of said stack for extending the circuit, from said tabs protruding into said bays.

5. An electronic system which comprises a connector unit formed of a stack of insulating sheets interleaved with a plurality of sheet-like conductors, each of said insulating sheets and conductors having at least a pair of apertures therein and being aligned with one another to form component bays in said stack, the apertures in said insulating sheets being of smaller dimensions than the apertures in said conductors to maintain electrical separation between said conductors, conductive tabs extending from said conductors into said bays, and a multiterminal circuit element in each of said bays with terminals thereon selectively connected to said tabs for support of said element in said bays and for extending conductive paths from each said element.

6. The combination set forth in claim 5 in which parallel connections between elements include a conductive path through one of said conductors and series connections between said elements include a conductive path through a second of said conductors.

7. The combination set forth in claim 5 in which means are provided for establishing separate connections to each of said sheet-like conductors from outside of said system.

8. An electronic system which comprises a connector unit formed of a stack of insulating sheets interleaved with a plurality of sheet-like conductors, each of said insulating sheets and conductors having at least a pair of apertures therein and being aligned with one another to form component bays in said stack, the apertures in said insulating sheets being of smaller dimension than the apertures in said conductors to maintain electrical separation between said conductors, conductive tabs extending from said sheet-like conductors into said bays, a multiterminal circuit element in each of said bays with terminals thereon selectively connected to said tabs for support of said element in said bays, and tabs forming parts of each of said conductors extending edgewise from said stack for extending conductive paths from each said element.

9. An electronic system which comprises a connector unit formed of a stack of insulating sheets interleaved with a plurality of sheet-like conductors, each of said insulating sheets and conductors having at least three apertures therein and being aligned with one another to form component bays in said stack, the apertures in said insulating sheets being of smaller dimension than the apertures in said conductors to maintain electrical separation between said conductors, conductive tabs extending from said conductors into said bays, a multiterminal circuit element in each of said bays, each said element having terminals thereon selectively connected to said tabs for support of said element in said bays and for extending conductive paths from the elements, one of said conductive paths including a first of said conductors connected to one terminal on each of said elements to form parallel connections thereto, a series connection between a first pair of said elements including a conductive path through a second of said conductors, and a series connection between a second pair of said elements including a third of said conductors.

10. The combination set forth in claim 9 wherein at least one of said sheet-like conductors is segmented for providing series connections between said elements.

References Cited in the file of this patent

UNITED STATES PATENTS 840,537 Weir ------------------ Jan. 8, 1907